(12) United States Patent
Gai et al.

(10) Patent No.: US 10,001,684 B2
(45) Date of Patent: Jun. 19, 2018

(54) ARRAY SUBSTRATE, DISPLAY PANEL AND DISPLAY DEVICE HAVING THE SAME, AND METHOD THEREOF

(71) Applicant: BOE TECHNOLOGY GROUP CO., LTD., Beijing (CN)

(72) Inventors: Cuili Gai, Beijing (CN); Zhongyuan Wu, Beijing (CN); Jingwen Yin, Beijing (CN); Longyan Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 131 days.

(21) Appl. No.: 15/036,918

(22) PCT Filed: Dec. 10, 2015

(86) PCT No.: PCT/CN2015/097044
§ 371 (c)(1),
(2) Date: May 16, 2016

(87) PCT Pub. No.: WO2016/206317
PCT Pub. Date: Dec. 29, 2016

(65) Prior Publication Data
US 2017/0168361 A1    Jun. 15, 2017

(30) Foreign Application Priority Data

Jun. 25, 2015 (CN) .......................... 2015 1 0358841

(51) Int. Cl.
*G02F 1/1362* (2006.01)
*H01L 27/02* (2006.01)
*G09G 3/20* (2006.01)

(52) U.S. Cl.
CPC .. *G02F 1/136204* (2013.01); *G02F 1/136259* (2013.01); *H01L 27/0248* (2013.01);
(Continued)

(58) Field of Classification Search
CPC ......... G02F 1/136204; G02F 1/136259; H01L 27/0248
See application file for complete search history.

(56) References Cited

U.S. PATENT DOCUMENTS

| 6,429,910 B1 | 8/2002 | Hirata et al. |
| 8,542,337 B2 * | 9/2013 | Zhang ................ H01L 27/0266 |
| | | 257/202 |

(Continued)

FOREIGN PATENT DOCUMENTS

| CN | 1731260 A | 2/2006 |
| CN | 1763597 A | 4/2006 |

(Continued)

OTHER PUBLICATIONS

First Office Action in the Chinese Patent Application No. 201510358841.4, dated May 16, 2017; English translation attached.

(Continued)

*Primary Examiner* — Dung Nguyen
(74) *Attorney, Agent, or Firm* — Intellectual Valley Law, P.C.

(57) ABSTRACT

The present application discloses an array substrate having a signal line; a common electrode line; an electrostatic discharge (ESD) protector comprising a first discharging terminal coupled to the signal line, and a second discharging terminal coupled to the common electrode line; and an ESD protector repair unit comprising a first repair terminal in close proximity to the first discharging terminal but separated from each other, a second repair terminal in close proximity to the common electrode line but separated from each other.

20 Claims, 5 Drawing Sheets

(52) U.S. Cl.
CPC ....... *G09G 3/20* (2013.01); *G09G 2300/0426* (2013.01); *G09G 2330/04* (2013.01); *G09G 2330/08* (2013.01)

(56) References Cited

U.S. PATENT DOCUMENTS

| | | | |
|---|---|---|---|
| 2007/0029615 A1 | 2/2007 | Lai | |
| 2007/0030408 A1 | 8/2007 | Lin et al. | |
| 2012/0249912 A1* | 10/2012 | Huang | G02F 1/1362 349/42 |
| 2016/0027372 A1* | 1/2016 | Yan | G02F 1/136204 345/211 |
| 2016/0187750 A1 | 6/2016 | Tang et al. | |

FOREIGN PATENT DOCUMENTS

| | | |
|---|---|---|
| CN | 101059636 A | 10/2007 |
| CN | 102543009 A | 7/2012 |
| CN | 102854679 A | 1/2013 |
| CN | 102967973 A | 3/2013 |
| CN | 103676370 A | 3/2014 |
| CN | 104503176 A | 4/2015 |
| CN | 104880881 A | 9/2015 |
| JP | 2001100229 A | 4/2001 |
| KR | 20080022800 A | 3/2008 |

OTHER PUBLICATIONS

International Search Report & Written Opinion dated Mar. 22, 2016 regarding PCT/CN2015/097044.

* cited by examiner

ARRAY SUBSTRATE, DISPLAY PANEL AND DISPLAY DEVICE HAVING THE SAME, AND METHOD THEREOF

CROSS-REFERENCE TO RELATED APPLICATION

This application is a national stage application under 35 U.S.C. § 371 of International Application No. PCT/CN2015/097044 filed Dec. 10, 2015, which claims priority to Chinese Patent Application No. 201510358841.4, filed Jun. 25, 2015, the contents of which are incorporated by reference in the entirety.

FIELD

The present invention relates to display technology, more particularly, to an array substrate, a display panel and a display device having the same, and a method thereof.

BACKGROUND

Thin film transistor is the key component in a liquid crystal display panel or an organic light emitting diode display panel. These display panels can accumulate significant charge in display mode or during the manufacturing process. Electrostatic discharge (ESD) is the main cause of damages due to electrical overstress in display panels. Various types of ESD protectors can be used in display panels. However, the ESD protectors themselves can also become damaged by ESD.

SUMMARY

In one aspect, the present invention provides an array substrate comprising a signal line; a common electrode line; an electrostatic discharge (ESD) protector comprising a first discharging terminal coupled to the signal line, and a second discharging terminal coupled to the common electrode line; and an ESD protector repair unit comprising a first repair terminal in close proximity to the first discharging terminal but insulated or otherwise separated from each other, a second repair terminal in close proximity to the common electrode line but insulated or otherwise separated from each other.

Optionally, the first repair terminal intersects with the first discharging terminal.

Optionally, the second repair terminal intersecting with the common electrode line.

Optionally, the ESD protector comprises a positive ESD protector; and the ESD protector repair unit comprises a positive ESD protector repair unit.

Optionally, the ESD protector comprises a negative ESD protector; and the ESD protector repair unit comprises a negative ESD protector repair unit.

Optionally, the ESD protector comprises a positive ESD protector and a negative ESD protector, and the ESD protector repair unit comprises a positive ESD protector repair unit and a negative ESD protector repair unit; the positive ESD protector comprising the first discharging terminal coupled to the signal line, and the second discharging terminal coupled to the common electrode line; the positive ESD protector repair unit comprising the first repair terminal in close proximity to the first discharging terminal but insulated or otherwise separated from each other, the second repair terminal in close proximity to the common electrode line but insulated or otherwise separated from each other; the negative ESD protector comprising a third discharging terminal coupled to a signal line, a fourth discharging terminal coupled to a common electrode line; and the negative ESD protector repair unit comprising a third repair terminal in close proximity to the third discharging terminal but insulated or otherwise separated from each other, a fourth repair terminal in close proximity to the common electrode line but insulated or otherwise separated from each other.

Optionally, when the ESD protector becomes dysfunctional, the first repair terminal is connected to the first discharging terminal, and the second repair terminal is connected to the common electrode line thereby repairs the dysfunctional ESD protector.

Optionally, the first repair terminal is connected to the first discharging terminal by fusing or by injecting a conductive material between the first repair terminal and the first discharging terminal. Optionally, the second repair terminal is connected to the common electrode line by fusing or by injecting a conductive material between the second repair terminal and the common electrode line.

Optionally, when the positive ESD protector becomes dysfunctional, the first repair terminal is fused with or connected to the first discharging terminal, and the second repair terminal is fused with or connected to the common electrode line thereby repairs the dysfunctional ESD protector.

Optionally, when the negative ESD protector becomes dysfunctional, the third repair terminal is fused with or connected to the third discharging terminal, and the fourth repair terminal is fused with or connected to the common electrode line thereby repairs the dysfunctional ESD protector.

Optionally, wherein the positive ESD protector comprises a first thin film transistor, a gate electrode and a source electrode of the first thin film transistor are coupled to the signal line through the first discharging terminal, a drain electrode of the first thin film transistor is coupled to the common electrode line through the second discharging terminal.

Optionally, the negative ESD protector comprises a second thin film transistor, a drain electrode of the second thin film transistor is coupled to the signal line through the third discharging terminal, a gate electrode and a source electrode of the second thin film transistor are coupled to the common electrode line through the fourth discharging terminal.

Optionally, the positive ESD protector repair unit comprises a third thin film transistor, a gate electrode and a source electrode of the third thin film transistor are coupled to the first repair terminal, a drain electrode of the third thin film transistor is coupled to the second repair terminal.

Optionally, the negative ESD protector repair unit comprises a fourth thin film transistor, a gate electrode and a source electrode of the fourth thin film transistor are coupled to the fourth repair terminal, a drain electrode of the fourth thin film transistor is coupled to the third repair terminal.

Optionally, the positive ESD protector and the negative ESD protector are integrated as an integrated ESD protector, the first discharging terminal and the third discharging terminal are joined together, and the second discharging terminal and the fourth discharging terminal are joined together.

Optionally, the positive ESD protector repair unit and the negative ESD protector repair unit are alternately arranged and spaced apart by the integrated ESD protector.

Optionally, the positive ESD protector repair unit is disposed between two positive ESD protectors from two neighboring integrated ESD protectors, and the negative ESD repair unit is disposed between two negative ESD protectors from two neighboring integrated ESD protectors.

Optionally, the positive ESD protector repair unit comprises a third thin film transistor, a gate electrode and a source electrode of the third thin film transistor are coupled to the first repair terminal, a drain electrode of the third thin film transistor is coupled to the second repair terminal; and the negative ESD protector repair unit comprises a fourth thin film transistor, a gate electrode and a source electrode of the fourth thin film transistor are coupled to the second repair terminal, a drain electrode of the fourth thin film transistor is coupled to the first repair terminal.

Optionally, the positive ESD protector and the positive ESD protector repair unit comprise a P-type thin film transistor.

Optionally, the negative ESD protector and the negative ESD protector repair unit comprise an N-type thin film transistor.

Optionally, the signal line is a data line or a gate line.

In another aspect, the present invention also provides a method of repairing an array substrate. The method comprises disconnecting a dysfunctional ESD protector from the signal line; fusing the first repair terminal of a neighboring ESD protector repair unit with the first discharging terminal, and fusing the second repair terminal of a neighboring ESD protector repair unit with the common electrode line.

In another aspect, the present invention also provides a display panel comprising an array substrate as described herein, or a display panel having the array substrate repaired by a method described herein.

In another aspect, the present invention further provides a display device comprising a display panel as described herein.

BRIEF DESCRIPTION OF THE FIGURES

The following drawings are merely examples for illustrative purposes according to various disclosed embodiments and are not intended to limit the scope of the present invention.

DETAILED DESCRIPTION OF THE EMBODIMENTS

The disclosure will now describe more specifically with reference to the following embodiments. It is to be noted that the following descriptions of some embodiments are presented herein for purpose of illustration and description only. It is not intended to be exhaustive or to be limited to the precise form disclosed.

Figure 1:
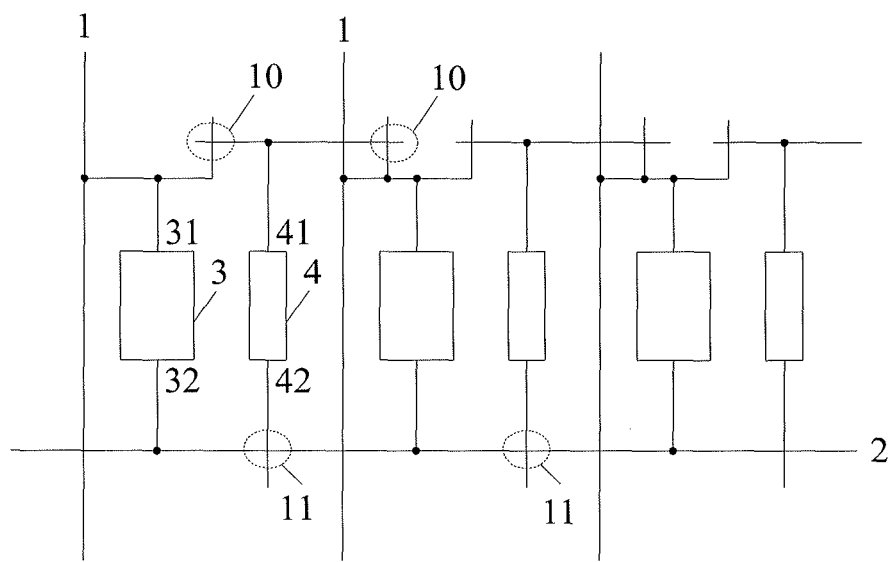
FIG. 1 is a diagram illustrating the structures of an ESD protector and an ESD protector repair unit in an embodiment.

FIG. 1 is a diagram illustrating the structures of an ESD protector and an ESD protector repair unit in an embodiment. Referring to FIG. 1, the array substrate in the embodiment includes a signal line 1, a common electrode line 2, an ESD protector 3 and an ESD protector repair unit 4. The ESD protector 3 in the embodiment includes a first discharging terminal 31 coupled to the signal line 1, and a second discharging terminal 32 coupled to the common electrode line 2. The ESD protector 3 protects the signal line 1 from ESD. The signal line 1 can be, for example, a data line or a gate line. The ESD protector repair unit 4 in the embodiment includes a first repair terminal 41 intersecting with or in close proximity to the first discharging terminal 31 but insulated or separated from each other (as shown in circle 10), and a second repair terminal 42 intersecting with or in close proximity to the common electrode line 2 but insulated or separated from each other (as shown in circle 11). Two termini are considered to be in close proximity if, e.g., they can be fused with or otherwise connected to each other upon, e.g., melting by external heat or laser. For example, two termini may be disposed at two different layers, intersect with each other, and be insulated from each other by an insulating layer or an insulating block. The insulating layer or block may be melted and removed, and the metal or conductive material of the termini may be melted so as to fuse the termini together. Alternatively, two termini may be disposed in close proximity at a same layer, separated by insulating material. The insulating material may be melted and removed, and the metal or conductive material of the termini may be melted so as to fuse the termini together. Optionally, two termini can be connected by injecting a conductive material between the two termini (e.g., by ink-jet printing a conductive material). When the ESD protector becomes dysfunctional, the first repair terminal 41 can be fused with or otherwise connected to the first discharging terminal 31, and the second repair terminal 42 can be fused with or otherwise connected to the common electrode line 2 to repair a dysfunctional ESD protector 3.

The ESD protector can comprise a positive ESD protector and/or a negative ESD protector. The ESD protector can also be an integrated ESD protector comprising both a positive ESD protector and a negative ESD protector.

Figure 2:
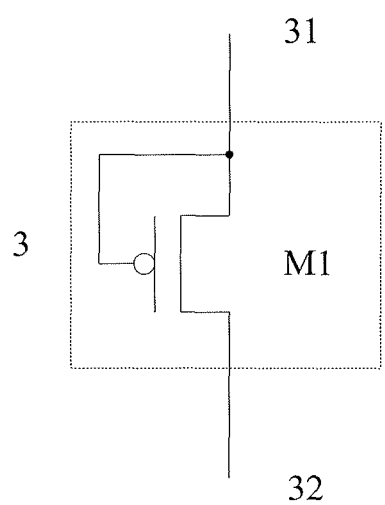
FIG. 2 is a diagram illustrating the structure of a positive ESD protector.

FIG. 2 is a diagram illustrating the structure of a positive ESD protector. Referring to FIG. 2, the positive ESD protector in the embodiment include a first thin film transistor M1. The gate electrode and the source electrode of the first thin film transistor M1 are coupled to the signal line 1 through the first discharging terminal 31. The drain electrode of the first thin film transistor M1 is coupled to the common electrode line 2 through the second discharging terminal 32.

Figure 3:
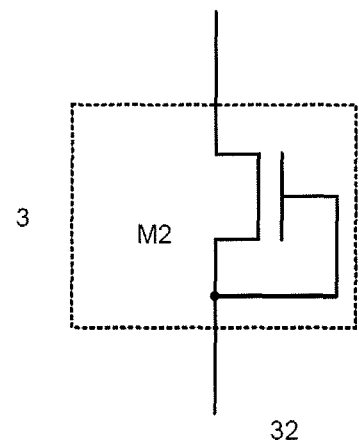
FIG. 3 is a diagram illustrating the structure of a negative ESD protector.

FIG. 3 is a diagram illustrating the structure of a negative ESD protector. Referring to FIG. 3, the negative ESD protector in the embodiment include a second thin film transistor M2. The drain electrode of the second thin film transistor M2 is coupled to the signal line 1 through the first discharging terminal 31. The gate electrode and the source electrode of the second thin film transistor M2 are coupled to the common electrode line 2 through the second discharging terminal 32.

Figure 4:
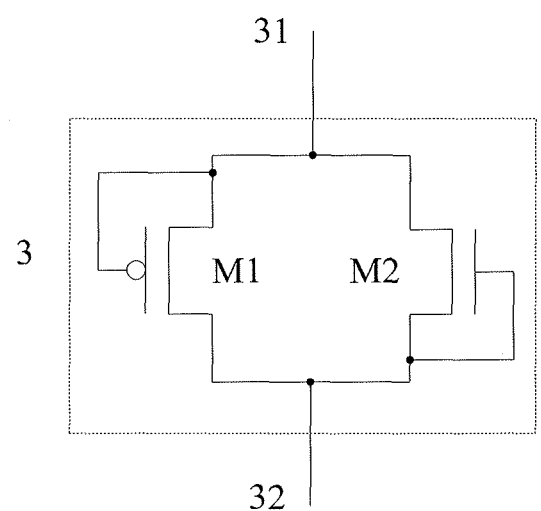
FIG. 4 is a diagram illustrating the structure of an integrated ESD protector.

FIG. 4 is a diagram illustrating the structure of an integrated ESD protector. Referring to FIG. 4, the integrated ESD protector in the embodiment includes a positive ESD protector and a negative ESD protector. The positive ESD protector in the embodiment include a first thin film transistor M1. The gate electrode and the source electrode of the first thin film transistor M1 are coupled to the signal line 1 through the first discharging terminal 31. The drain electrode of the first thin film transistor M1 is coupled to the common electrode line 2 through the second discharging terminal 32. The negative ESD protector in the embodiment include a second thin film transistor M2. The drain electrode of the second thin film transistor M2 is coupled to the signal line 1 through the first discharging terminal 31. The gate electrode and the source electrode of the second thin film transistor M2 are coupled to the common electrode line 2 through the second discharging terminal 32. The first discharging terminal and the third discharging terminal are joined together, and the second discharging terminal and the fourth discharging terminal are joined together.

The array substrate can have only positive ESD protectors, or only negative ESD protectors, or a combination of positive and negative ESD protectors. When the array substrate include both positive and negative ESD protectors, they can be provided as integrated ESD protectors, e.g., as integrated ESD protection units each of which contains one or more positive ESD protectors and one or more negative ESD protectors. Optionally, when the array substrate include both positive and negative ESD protectors, they can also be provided as separated units, i.e., not integrated. Various combinations of positive and negative ESD protectors can be used.

Figure 5:
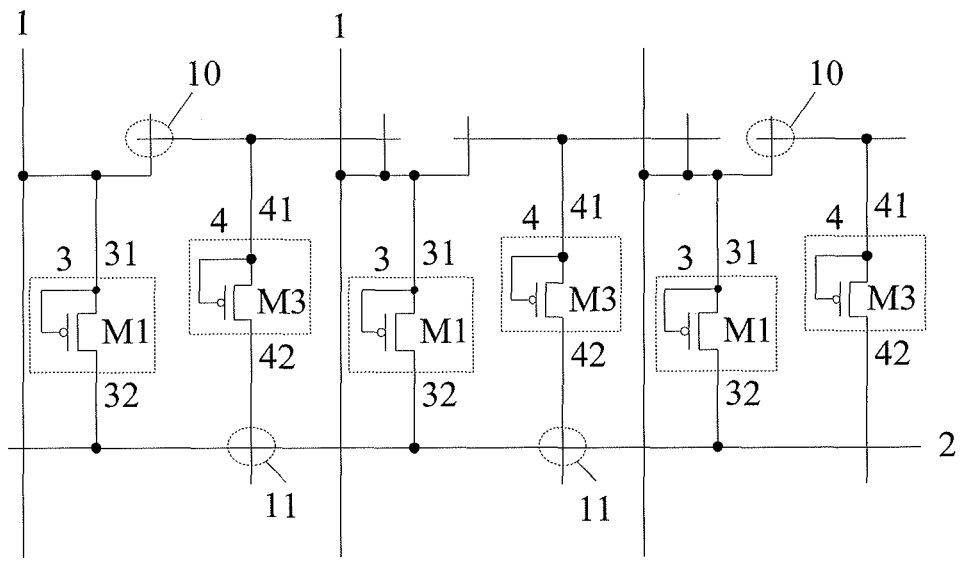
FIG. 5 is a diagram illustrating the structures of an array substrate comprising an ESD protector and an ESD protector repair unit in one embodiment.

FIG. 5 is a diagram illustrating the structures of an array substrate comprising an ESD protector and an ESD protector repair unit in one embodiment. Referring to FIG. 5, the array substrate in the embodiment includes a signal line 1, a common electrode line 2, a positive ESD protector 3, and a positive ESD protector repair unit 4. The positive ESD protector 3 has a first discharging terminal 31 coupled to the signal line 1, and a second discharging terminal 32 coupled to the common electrode line 2. The positive ESD protector repair unit 4 has a first repair terminal 41 intersecting with or in close proximity to the first discharging terminal 31 but insulated or separated from each other (as shown in circle 10), and a second repair terminal 42 intersecting with or in close proximity to the common electrode line 2 but insulated or separated from each other (as shown in circle 11). When the positive ESD protector 3 becomes dysfunctional, the first repair terminal 41 is fused with or otherwise connected to the first discharging terminal 31, and the second repair terminal 42 is fused with or otherwise connected to the common electrode line 2 to repair a dysfunctional ESD protector 3. Optionally, the positive ESD protector 3 includes a first thin film transistor M1. The gate electrode and the source electrode of the first thin film transistor M1 are coupled to the signal line 1 through the first discharging terminal 31, the drain electrode of the first thin film transistor M1 is coupled to the common electrode line 2 through the second discharging terminal 32. Optionally, the positive ESD protector repair unit 4 includes a third thin film transistor M3. The gate electrode and the source electrode of the third thin film transistor M3 are coupled to the first repair terminal 41, the drain electrode of the third thin film transistor M3 is coupled to the second repair terminal 42.

Figure 6:
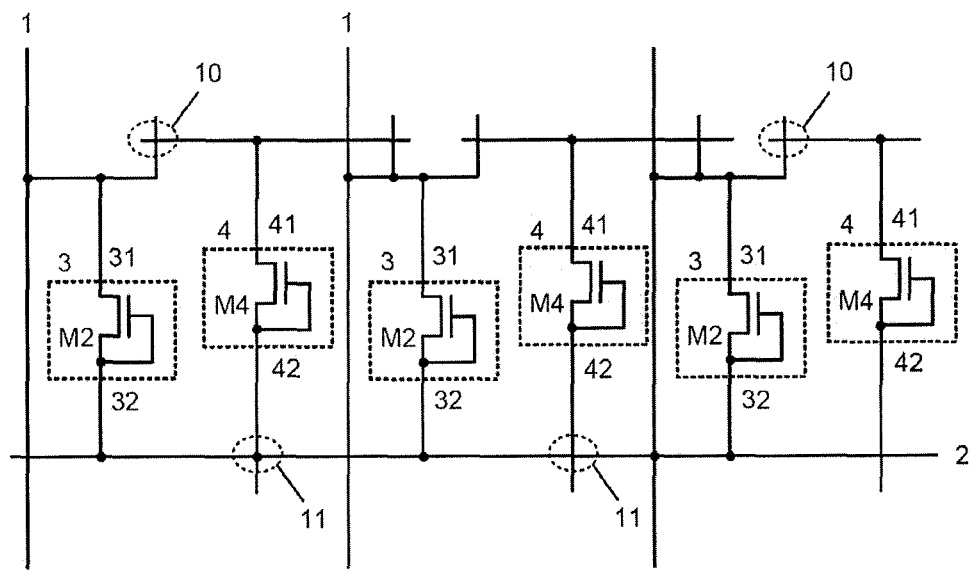
FIG. 6 is a diagram illustrating the structures of an array substrate comprising an ESD protector and an ESD protector repair unit in another embodiment.

FIG. 6 is a diagram illustrating the structures of an array substrate comprising an ESD protector and an ESD protector repair unit in another embodiment. Referring to FIG. 6, the array substrate in the embodiment includes a signal line 1, a common electrode line 2, a negative ESD protector 3, and a negative ESD protector repair unit 4. The negative ESD protector 3 has a third discharging terminal 31 coupled to the signal line, and a fourth discharging terminal 32 coupled to the common electrode line. The negative ESD protector repair unit 4 has a third repair terminal 41 intersecting with or in close proximity to the third discharging terminal 31 but insulated or separated from each other (as shown in circle 10), and a fourth repair terminal 42 intersecting with or in close proximity to the common electrode line but insulated or separated from each other (as shown in circle 11). When the negative ESD protector 3 becomes dysfunctional, the third repair terminal 41 is fused with or otherwise connected to the third discharging terminal 31, and the fourth repair terminal 42 is fused with or otherwise connected to the common electrode line 2 to repair a dysfunctional ESD protector 3. Optionally, the negative ESD protector 3 includes a second thin film transistor M2. The drain electrode of the second thin film transistor M2 is coupled to the signal line 1 through the third discharging terminal 31. The gate electrode and the source electrode of the second thin film transistor M2 are coupled to the common electrode line 2 through the fourth discharging terminal 32. Optionally, the negative ESD protector repair unit 4 includes a fourth thin film transistor M4. The gate electrode and the source electrode of the fourth thin film transistor M4 are coupled to the fourth repair terminal, a drain electrode of the fourth thin film transistor is coupled to the third repair terminal.

Figure 7:
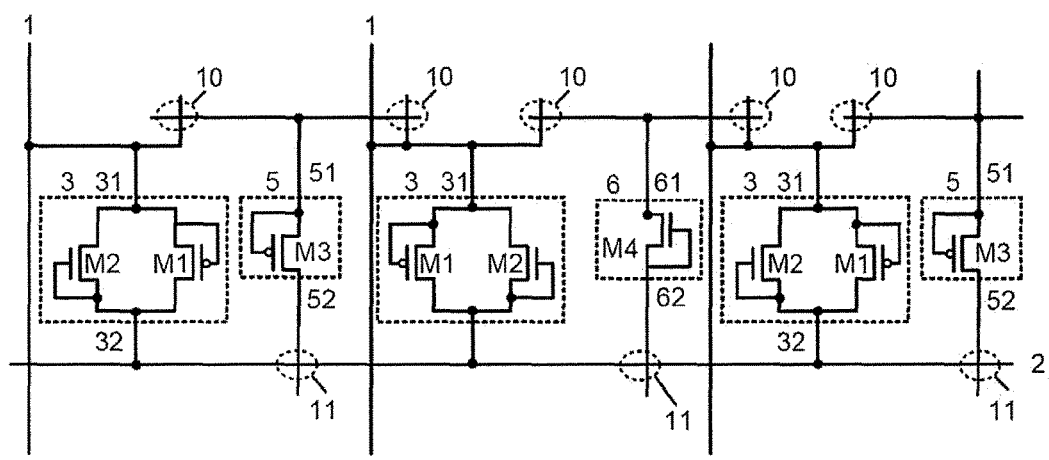
FIG. 7 is a diagram illustrating the structures of an array substrate comprising an ESD protector and an ESD protector repair unit in another embodiment.

FIG. 7 is a diagram illustrating the structures of an array substrate comprising an ESD protector and an ESD protector repair unit in another embodiment. Referring to FIG. 7, the array substrate in the embodiment includes a signal line 1, a common electrode line 2, an integrated ESD protector 3 having a positive ESD protector and a negative ESD protector, a positive ESD protector repair unit 5, and a negative ESD protector repair unit 6. The integrated ESD protector has a first discharging terminal 31 coupled to the signal line 1 and a second discharging terminal 32 coupled to the common electrode line 2. The discharging terminals are shared by the positive ESD protector and the negative ESD protector.

Optionally, the positive ESD protector and the negative ESD protector are not integrated. Optionally, the positive ESD protector and the negative ESD protector are separated. Optionally, the positive ESD protector has a first discharging terminal coupled to the signal line 1 and a second discharging terminal 32 coupled to the common electrode line 2, the negative ESD protector has a third discharging terminal coupled to a signal line, a fourth discharging terminal coupled to a common electrode line.

Optionally, the array substrate can have only positive ESD protector repair units or only negative ESD protector repair units, or a combination of positive and negative ESD protector repair units. When the array substrate include both positive and negative ESD protector repair units, they can be provided at positions corresponding to positive ESD protectors and negative ESD protectors. They may be provided as separated units, i.e., not integrated, or optionally as integrated units. Various combinations of positive and negative ESD protector repair units can be used.

Referring to FIG. 7, the positive ESD protector repair unit 5 in the embodiment has a first repair terminal 51 intersecting with or in close proximity to the first discharging terminal 31 but insulated or separated from each other (as shown in circle 10), and a second repair terminal 52 intersecting with or in close proximity to the common electrode line 2 but insulated or separated from each other (as shown in circle 11). The negative ESD protector repair unit 6 has a third repair terminal 61 intersecting with or in close proximity to the third discharging terminal 31 but insulated or separated from each other (as shown in circle 10), a fourth repair terminal 62 intersecting with or in close proximity to the common electrode line 2 but insulated or separated from each other (as shown in circle 11). When a positive ESD protector becomes dysfunctional, the first repair terminal 51 is fused with or otherwise connected to the first discharging terminal 31, and the second repair terminal 52 is fused with or otherwise connected to the common electrode line 2 to repair the dysfunctional positive ESD protector. When a negative ESD protector becomes dysfunctional, the third repair terminal 61 is fused with or otherwise connected to the third discharging terminal 31, and the fourth repair terminal 62 is fused with or otherwise connected to the common electrode line 2 to repair the dysfunctional negative ESD protector.

Referring to FIG. 7, the positive ESD protector in the embodiment includes a first thin film transistor M1. The gate electrode and the source electrode of the first thin film transistor M1 are coupled to the signal line 1 through the first discharging terminal 31. The drain electrode of the first thin film transistor M1 is coupled to the common electrode line 2 through the second discharging terminal 32. The negative ESD protector includes a second thin film transistor M2. The drain electrode of the second thin film transistor M2 is coupled to the signal line 1 through the first discharging terminal 31, a gate electrode and a source electrode of the second thin film transistor are coupled to the common electrode line 2 through the second discharging terminal 32.

Optionally, the positive ESD protector and the negative ESD protector are not integrated. Optionally, the positive ESD protector includes a first thin film transistor. The gate electrode and the source electrode of the first thin film transistor are coupled to the signal line through the first discharging terminal. The drain electrode of the first thin film transistor is coupled to the common electrode line through the second discharging terminal. Optionally, the negative ESD protector includes a second thin film transistor. The drain electrode of the second thin film transistor is coupled to the signal line through the third discharging terminal. The gate electrode and the source electrode of the second thin film transistor are coupled to the common electrode line through the fourth discharging terminal.

Referring to FIG. 7, the positive ESD protector repair unit 5 in the embodiment include a third thin film transistor M3. The gate electrode and a source electrode of the third thin film transistor M3 are coupled to the first repair terminal 51. The drain electrode of the third thin film transistor M3 is coupled to the second repair terminal 52. The negative ESD protector repair unit 6 in the embodiment includes a fourth thin film transistor M4. The gate electrode and the source electrode of the fourth thin film transistor M4 are coupled to the fourth repair terminal 62. The drain electrode of the fourth thin film transistor M4 is coupled to the third repair terminal 61.

In some embodiments, the positive ESD protector repair unit and the negative ESD protector repair unit are alternately arranged and spaced apart by the integrated ESD protector. In some embodiments (as shown in FIG. 7), the positive ESD protector repair unit is disposed between two positive ESD protectors from two neighboring integrated ESD protectors, and the negative ESD repair unit is disposed between two negative ESD protectors from two neighboring integrated ESD protectors. Optionally, the positive ESD protector repair unit comprises a third thin film transistor. The gate electrode and the source electrode of the third thin film transistor are coupled to the first repair terminal. The drain electrode of the third thin film transistor is coupled to the second repair terminal. Optionally, the negative ESD protector repair unit comprises a fourth thin film transistor. The gate electrode and a source electrode of the fourth thin film transistor are coupled to the second repair terminal. The drain electrode of the fourth thin film transistor is coupled to the first repair terminal.

In some embodiments, the positive ESD protector repair unit and the negative ESD protector repair unit are integrated. In some embodiments, the positive ESD protector repair unit and the negative ESD protector repair unit are integrated; and the positive ESD protector and the negative ESD protector are also integrated; and the integrated ESD protectors and the integrated ESD protector repair units are alternately arranged and spaced apart by each other. In some embodiments, the positive ESD protector repair unit and the negative ESD protector repair unit are integrated; however, the positive ESD protector and the negative ESD protector are not integrated but separated, and the positive ESD protector and the negative ESD protector are alternately arranged and spaced apart by the integrated ESD protector repair unit.

Optionally, the positive ESD protector and the positive ESD protector repair unit comprise a P-type thin film transistor. Optionally, the negative ESD protector and the negative ESD protector repair unit comprise an N-type thin film transistor. Optionally, M1 is a P-type thin film transistor and M2 is an N-type thin film transistor. Optionally, M3 is a P-type thin film transistor and M4 is an N-type thin film transistor. Optionally, the signal line is a data line or a gate line.

In some embodiments, the array substrate includes a positive ESD protector having a first thin film transistor and a negative ESD protector having a second thin film transistor. The gate electrode and the source electrode of the first thin film transistor are coupled to the signal line through the first discharging terminal. The drain electrode of the first thin film transistor is coupled to the common electrode line through the second discharging terminal. The drain electrode of the second thin film transistor is coupled to the signal line through the third discharging terminal. The gate electrode and the source electrode of the second thin film transistor are coupled to the common electrode line through the fourth discharging terminal.

In some embodiments, the array substrate includes a positive ESD protector repair unit having a third thin film transistor and a negative ESD protector repair unit having a fourth thin film transistor. The gate electrode and the source electrode of the third thin film transistor are coupled to the first repair terminal. The drain electrode of the third thin film transistor is coupled to the second repair terminal. The gate electrode and the source electrode of the fourth thin film transistor are coupled to the fourth repair terminal. The drain electrode of the fourth thin film transistor is coupled to the third repair terminal.

In some embodiments, the array substrate includes a positive ESD protector having a first thin film transistor, a negative ESD protector having a second thin film transistor, a positive ESD protector repair unit having a third thin film transistor, and a negative ESD protector repair unit having a fourth thin film transistor. The gate electrode and the source electrode of the first thin film transistor are coupled to the signal line through the first discharging terminal. The drain electrode of the first thin film transistor is coupled to the common electrode line through the second discharging terminal. The drain electrode of the second thin film transistor is coupled to the signal line through the third discharging terminal. The gate electrode and the source electrode of the second thin film transistor are coupled to the common electrode line through the fourth discharging terminal. The gate electrode and the source electrode of the third thin film transistor are coupled to the first repair terminal. The drain electrode of the third thin film transistor is coupled to the second repair terminal. The gate electrode and the source electrode of the fourth thin film transistor are coupled to the fourth repair terminal. The drain electrode of the fourth thin film transistor is coupled to the third repair terminal.

Figure 8:
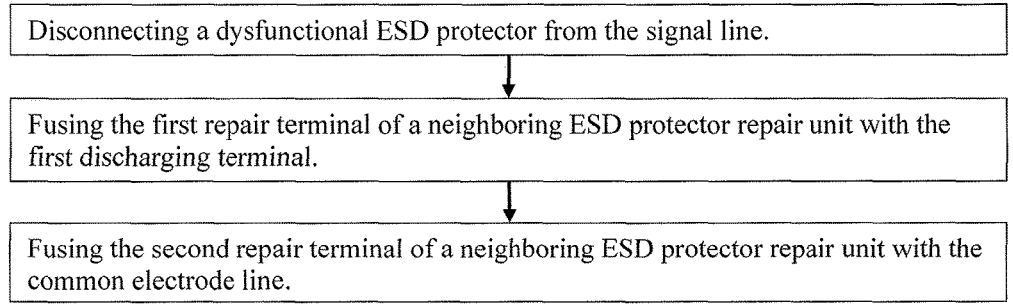
FIG. 8 is a flow chart illustrating a method of repair an array substrate according an embodiment.

FIG. 8 is a flow chart illustrating a method of repair an array substrate according an embodiment. Referring to FIG. 8, the method in the embodiment includes disconnecting a dysfunctional ESD protector from the signal line, fusing the first repair terminal of a neighboring ESD protector repair unit with the first discharging terminal, and fusing the second repair terminal of a neighboring ESD protector repair unit with the common electrode line. In some embodiments, the method includes disconnecting a dysfunctional positive ESD protector from the signal line, fusing the first repair terminal of a neighboring positive ESD protector repair unit with the first discharging terminal, and fusing the second repair terminal of a neighboring positive ESD protector repair unit with the common electrode line. In some embodiments, the method includes disconnecting a dysfunctional negative ESD protector from the signal line, fusing the first repair terminal of a neighboring negative ESD protector repair unit with the first discharging terminal, and fusing the second repair terminal of a neighboring negative ESD protector repair unit with the common electrode line.

In some embodiments, the array substrate includes both positive ESD protectors, negative ESD protectors, positive ESD protector repair units, and negative ESD protector repair units. Optionally, when one or more positive ESD protectors become dysfunctional, the method includes disconnecting a dysfunctional positive ESD protector from the signal line, fusing the first repair terminal of a neighboring positive ESD protector repair unit with the first discharging terminal, and fusing the second repair terminal of a neighboring positive ESD protector repair unit with the common electrode line. Optionally, when one or more positive ESD protectors become dysfunctional, the method includes disconnecting a dysfunctional negative ESD protector from the common electrode line; fusing the third repair terminal of a neighboring negative ESD protector repair unit with the third discharging terminal; and fusing the fourth repair terminal of a neighboring positive ESD protector repair unit with the common electrode line.

Figure 9:
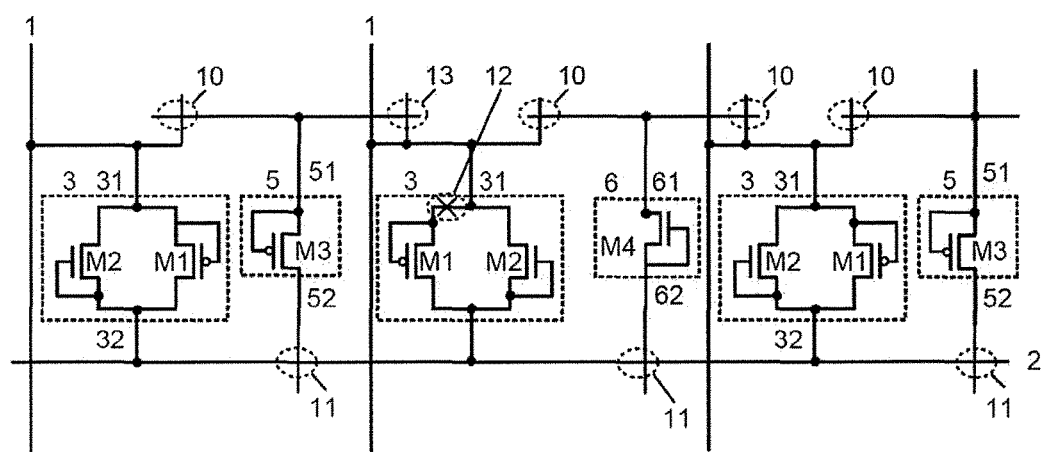
FIG. 9 is a diagram illustrating the repaired structures of the array substrate of FIG. 7.

FIG. 9 is a diagram illustrating the repaired structures of the array substrate of FIG. 7. Referring to FIG. 9, when short circuit occurs in the positive ESD protector in the integrated ESD protector 3, the array substrate can be repaired using a positive ESD protector repair unit 5. The dysfunctional positive ESD protector M1 is disconnected from the signal line 1 (as shown in circle 12). The first repair terminal 51 is fused with or otherwise connected to the first discharging terminal 31 (as shown in circle 13). The second repair terminal 52 is fused with or otherwise connected to the common electrode line 2. In the repaired array substrate, the positive ESD protector repair unit 5 protects the signal line 1 from positive ESD. Similarly, when short circuit occurs in the negative ESD protector in the integrated ESD protector 3, the array substrate can be repaired using a negative ESD protector repair unit 6. The dysfunctional negative ESD protector M2 is disconnected from the common electrode line 2. The third repair terminal 61 is fused with or otherwise connected to the first discharging terminal 31. The fourth repair terminal 62 is fused with or otherwise connected to the common electrode line 2. In the repaired array substrate, the negative ESD protector repair unit 6 protects the signal line 1 from negative ESD.

The present invention also provides a display panel having the array substrate described herein, and a display device having the display panel described herein. In addition, the present invention further provides a display panel having the array substrate repaired by a method described herein, and a display device having the display panel so repaired.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising:
   a signal line;
   a common electrode line;
   an electrostatic discharge (ESD) protector comprising a first discharging terminal coupled to the signal line, and a second discharging terminal coupled to the common electrode line; and
   an ESD protector repair unit comprising a first repair terminal in close proximity to, and insulated from, the first discharging terminal, and a second repair terminal in close proximity to, and insulated from, the common electrode line;
   wherein the ESD protector repair unit is insulated from the ESD protector and insulated from the common electrode line.

2. The array substrate of claim 1, wherein an orthographic projection of the first repair terminal on a base substrate of the array substrate intersects with an orthographic projection of the first discharging terminal on the base substrate, and an orthographic projection of the second repair terminal on the base substrate intersects with the common electrode line.

3. The array substrate of claim 1, wherein
the ESD protector comprises a positive ESD protector; and
the ESD protector repair unit comprises a positive ESD protector repair unit.

4. The array substrate of claim 3, wherein the positive ESD protector comprises a first thin film transistor, a gate electrode and a source electrode of the first thin film transistor are coupled to the signal line through the first discharging terminal, a drain electrode of the first thin film transistor is coupled to the common electrode line through the second discharging terminal.

5. The array substrate of claim 3, wherein the positive ESD protector repair unit comprises a third thin film transistor, a gate electrode and a source electrode of the third thin film transistor are coupled to the first repair terminal, a drain electrode of the third thin film transistor is coupled to the second repair terminal.

6. The array substrate of claim 3, wherein the positive ESD protector and the positive ESD protector repair unit comprise a P-type thin film transistor.

7. The array substrate of claim 1, wherein:
the ESD protector comprises a negative ESD protector; and
the ESD protector repair unit comprises a negative ESD protector repair unit.

8. The array substrate of claim 7, wherein the negative ESD protector comprises a second thin film transistor, a drain electrode of the second thin film transistor is coupled to the signal line through the third discharging terminal, a gate electrode and a source electrode of the second thin film transistor are coupled to the common electrode line through the fourth discharging terminal.

9. The array substrate of claim 7, wherein the negative ESD protector repair unit comprises a fourth thin film transistor, a gate electrode and a source electrode of the fourth thin film transistor are coupled to the fourth repair terminal, a drain electrode of the fourth thin film transistor is coupled to the third repair terminal.

10. The array substrate of claim 7, wherein the negative ESD protector and the negative ESD protector repair unit comprise an N-type thin film transistor.

11. The array substrate of claim 1, wherein:
the ESD protector comprises a positive ESD protector and a negative ESD protector, and the ESD protector repair unit comprises a positive ESD protector repair unit and a negative ESD protector repair unit;
the positive ESD protector comprising the first discharging terminal coupled to the signal line, and the second discharging terminal coupled to the common electrode line;
the positive ESD protector repair unit comprising the first repair terminal in close proximity to, and insulated from, the first discharging terminal, and the second repair terminal in close proximity to, and insulated from, the common electrode line;
the negative ESD protector comprising a third discharging terminal coupled to a signal line, a fourth discharging terminal coupled to a common electrode line; and
the negative ESD protector repair unit comprising a third repair terminal in close proximity to, and insulated from, the third discharging terminal, a fourth repair terminal in close proximity to, and insulated from, the common electrode line.

12. The array substrate of claim 11, wherein:
when the positive ESD protector becomes dysfunctional, the first repair terminal is fused with or connected to the first discharging terminal, and the second repair terminal is fused with or connected to the common electrode line thereby repairs the dysfunctional ESD protector;
when the negative ESD protector becomes dysfunctional, the third repair terminal is fused with or connected to the third discharging terminal, and the fourth repair terminal is fused with or connected to the common electrode line thereby repairs the dysfunctional ESD protector.

13. The array substrate of claim 11, wherein the positive ESD protector and the negative ESD protector are integrated as an integrated ESD protector, the first discharging terminal and the third discharging terminal are joined together, and the second discharging terminal and the fourth discharging terminal are joined together.

14. The array substrate of claim 13, wherein the positive ESD protector repair unit and the negative ESD protector repair unit are alternately arranged and spaced apart by the integrated ESD protector.

15. The array substrate of claim 14, wherein the positive ESD protector repair unit is disposed between two positive ESD protectors from two neighboring integrated ESD protectors, and the negative ESD repair unit is disposed between two negative ESD protectors from two neighboring integrated ESD protectors, wherein
the positive ESD protector repair unit comprises a third thin film transistor, a gate electrode and a source electrode of the third thin film transistor are coupled to the first repair terminal, a drain electrode of the third thin film transistor is coupled to the second repair terminal; and
the negative ESD protector repair unit comprises a fourth thin film transistor, a gate electrode and a source electrode of the fourth thin film transistor are coupled to the second repair terminal, a drain electrode of the fourth thin film transistor is coupled to the first repair terminal.

16. The array substrate of claim 1, wherein, when the ESD protector becomes dysfunctional, the first repair terminal is connected to the first discharging terminal, and the second repair terminal is connected to the common electrode line thereby repairs the dysfunctional ESD protector;
wherein the first repair terminal is connected to the first discharging terminal by fusing or by injecting a conductive material between the first repair terminal and the first discharging terminal; and the second repair terminal is connected to the common electrode line by fusing or by injecting a conductive material between the second repair terminal and the common electrode line.

17. The array substrate of claim 1, wherein the signal line is a data line or a gate line.

18. A display panel comprising an array substrate of claim 1.

19. A display device comprising a display panel of claim 18.

20. A method of repairing an array substrate, wherein the array substrate comprises:
a signal line;
a common electrode line;
an electrostatic discharge (ESD) protector comprising a first discharging terminal coupled to the signal line, and a second discharging terminal coupled to the common electrode line; and an ESD protector repair unit comprising a first repair terminal in close proximity to, and insulated from, the first discharging terminal, and a second repair terminal in close proximity to, and insulated from, the common electrode line;

wherein the ESD protector repair unit is insulated from the ESD protector and insulated from the common electrode line;

wherein the method comprising:

disconnecting a dysfunctional ESD protector from the signal line;

fusing the first repair terminal of a neighboring ESD protector repair unit with the first discharging terminal, and fusing the second repair terminal of a neighboring ESD protector repair unit with the common electrode line.

* * * * *